United States Patent [19]

Puckett

[11] 4,011,584
[45] Mar. 8, 1977

[54] SYSTEM FOR COLOR PRESENTATION OF INFORMATION REPRESENTED BY AMPLITUDE VARYING VIDEO SIGNAL

[76] Inventor: Lawrence C. Puckett, 4600 Burnett Road, Austin, Tex. 78757

[22] Filed: Sept. 17, 1974

[21] Appl. No.: 506,720

Related U.S. Application Data

[63] Continuation-in-part of Ser. No. 198,878, Nov. 15, 1971, abandoned, and a continuation-in-part of Ser. No. 310,460, Nov. 29, 1972, abandoned, and a continuation-in-part of Ser. No. 438,550, Feb. 1, 1974, abandoned.

[52] U.S. Cl. .................................. 358/82; 178/68; 324/77 D
[51] Int. Cl.² ........................................ H04N 9/02
[58] Field of Search .................. 340/347 AD, 171; 324/99 D, 77 D; 332/30 V; 250/65, 93, 71 R; 179/1 VS; 178/5.8 R; 329/203; 358/80, 81, 82

[56] References Cited

UNITED STATES PATENTS

| 1,558,909 | 10/1925 | Nichols | 325/138 |
|---|---|---|---|
| 2,005,084 | 6/1935 | Hansell et al. | 325/138 |
| 2,593,925 | 4/1952 | Sheldon | 178/6.8 |
| 3,258,694 | 6/1966 | Shepherd | 325/145 |
| 3,581,192 | 5/1971 | Miura et al. | 179/1 VS |
| 3,714,577 | 1/1973 | Hayes | 325/138 |

FOREIGN PATENTS OR APPLICATIONS

| 711,762 | 7/1954 | United Kingdom | 347 AD/ |
|---|---|---|---|

OTHER PUBLICATIONS

Grob, "Basic Television Principles and Servicing," McGraw-Hill Book Co., Inc., 1954, pp. 84, 85.
Landee et al., "Electronic Designers' Handbook," McGraw-Hill Book Co., 1957, pp. 5-22 to 5-27.

*Primary Examiner*—Thomas J. Sloyan
*Attorney, Agent, or Firm*—Kenneth R. Glaser

[57] ABSTRACT

Disclosed is signal generating apparatus for presenting data, the status of which is to be detected, by converting to an electronic signal having an amplitude representative of that status, the so-converted electronic signal being utilized to generate a single sideband signal coupled to one or more color primary channels for respectively producing one or more output signals representing the amplitude, appropriate output means being connected to each channel for displaying or responding to the output signals.

6 Claims, 8 Drawing Figures

SYSTEM FOR COLOR PRESENTATION OF INFORMATION REPRESENTED BY AMPLITUDE VARYING VIDEO SIGNAL

This application is a continuation-in-part of application Ser. No. 198,878, filed Nov. 15, 1971, now abandoned; a continuation-in-part of application Ser. No. 310,460, filed Nov. 29, 1972, now abandoned; and a continuation-in-part of application Ser. No. 438,550, filed Feb. 1, 1974, now abandoned.

The present invention relates generally to apparatus and a method for electronically representing the status of information, more specifically to a method and apparatus for producing output signals representative of the received information, and even more specifically to a modulation apparatus for producing one or more output signals representative of the amplitude of incoming signals.

There are many applications which require the electronic presentation of information which exists or has been generated in some other format. For example, it is often necessary to generate electronic signals representative of the current condition or status of an object, such as the temperature of a substance, the position of a body, the color of an element, etc., the resulting generated signals then being utilized to display, or actuate or control output utilization apparatus responsive to, changes in this status. Even when the incoming information is already represented by electrical signals, it is often necessary to convert these signals to some other form (analog-to-digital, digital-to-analog, etc.) indicative of the information. While there presently are systems on the market which broadly accomplish these objectives, they have not been entirely acceptable under all conditions of service.

It is therefore a primary object of the invention to provide a new and improved system and method for electronically representing information existing in a non-electronic format.

It is another object of the invention to provide new and improved apparatus for representing information by way of one or more electrical signals the amplitude of which is employed to indicate the status of the information.

It is an even further object of the invention to provide new and improved modulation and detection apparatus for converting signals, which amplitudes are representative of the status of received information, to a plurality of output signals indicative of that amplitude.

In accordance with these and other objects, the present invention is directed to signal generating apparatus comprising a signal transducer for converting information, the status of which is to be detected, to an electronic signal having an amplitude representative of that status. The amplitude of the electronic signal is then utilized to generate a modulated signal which is coupled to a plurality of decoder or selection channels for respectively producing one or more output signals representing said amplitude, and therefore the status of the received information. The output signals may then be coupled to an appropriate utilization means for displaying or responding to this status.

In accordance with a preferred embodiment of the invention, the modulation and converting is effected by apparatus including a frequency modulator which modulates an oscillator signal in accordance with the amplitude of an incoming video information signal, the so modulated signal being coupled, after suppression of the carrier, to a plurality of color primary channels, various frequencies of sideband modulation being associated with the signals inputted to the color channels. The output signals from the respective channels are then indicative of the amplitude of the incoming information signal.

In accordance with a feature of the invention, zone enhance circuitry is switched into and out of the basic system to selectively provide that an increment of amplitude range of the input signal may be selected and expanded in amplitude.

Additional features, as well as other objects and advantages, of the invention will become apparent from the following detailed description taken in conjunction with the accompanying drawings in which.

Figure 1:
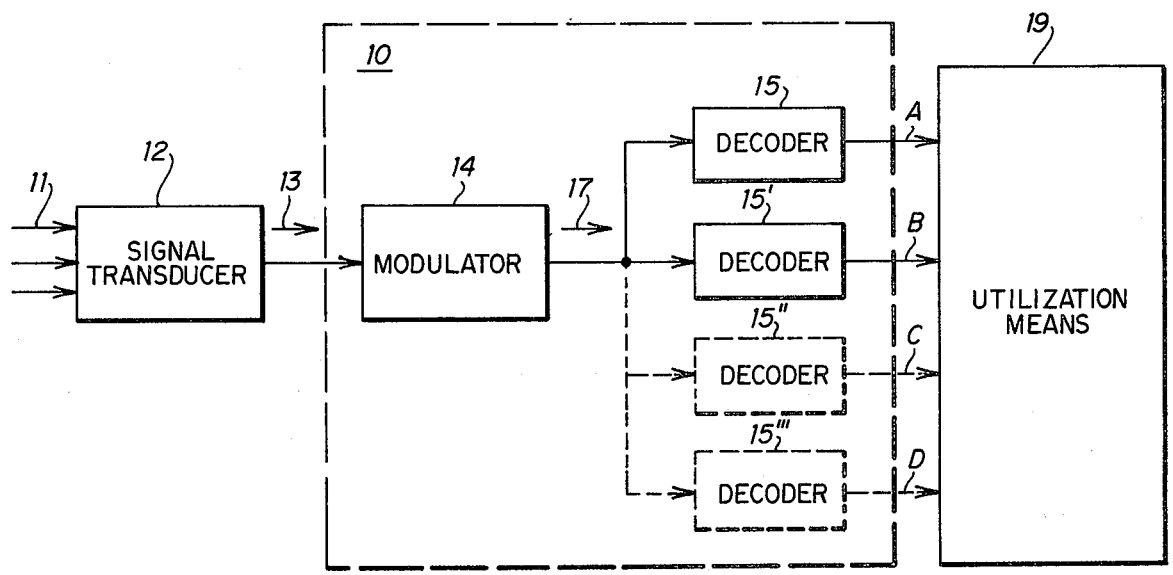
FIG. 1 is an overall block diagram schematic of the signal generating apparatus of the invention.

Referring now to FIG. 1, the apparatus 10 of the present invention is broadly depicted as including a modulator portion 14 for producing an output signal modulated in accordance with the amplitude of an incoming electrical signal 13. The resulting modulated output signal 17 is then respectively applied to the input of a plurality of decoders 15, 15', 15'', 15''', etc., to produce a plurality of respective output signals A, B, C, D, etc., which are representative of the amplitude of the incoming signal 13. These output signals may be in digital form (the presence or absence of either signal A, B, C, or D indicating the amplitude of the incoming signal) or they may be in analog form (the relative magnitude or level of the signals A, B, C, D being indicative of the incoming signal amplitude).

In accordance with a unique application of the apparatus 10, the incoming electrical signal 13 is produced at the output of a signal transducer 12 which converts information or data 11 received by it in a non-electrical format into the signal (or signals) 13, the amplitude of which is representative of the status of the information or data 11. For example, the means 12 may be a displacement transducer, such as a linear potentiometer, translating the position 11 of a mechanical object, such as the core of a solenoid valve, into an analog electrical signal 13 having an amplitude indicative of that position. Alternatively, the transducer 12 may be one portion of a radar detection system whereby the output signal 13 is an electronic representation of the magnitude or strength (and therefore distance) of radiation 11 received by the radar system. Many other forms of transducers 12 may be utilized, it only being important that the signal 13 have an amplitude representative of the status of the incoming information 11.

The incoming signals 13 are then processed by the apparatus 10 to produce signals at one or more of the outputs of the decoders 15, 15', etc., representative of the amplitude of the signal 13. These output signals are then applied to the inputs of a utilization means 19 which displays or activates other circuitry in response to the presence or absence of, or the relative magnitude of, signals A, B, C, etc. The utilization means may be comprised of various types of apparatus depending upon the particular application. For example, assume that it is desired to display information pertaining to the existing temperature within a furnace used in any manufacturing process. The signal transducer 12 could then be a pyrometer such as a thermocouple, producing an electrical signal 13 representative of the temperature data 11. A plurality of decoders 15, 15', etc., could then produce a digital signal at their respective outputs when the magnitude of the electrical signal 13 (corresponding to the specific temperature ranges) reaches the predetermined value. For example, a signal A may represent 150° C, B - 200° C; C - 300° C, etc. The resulting digital signal could then actuate a corresponding light associated with utilization means 19 to display the specific temperature.

Figure 2:
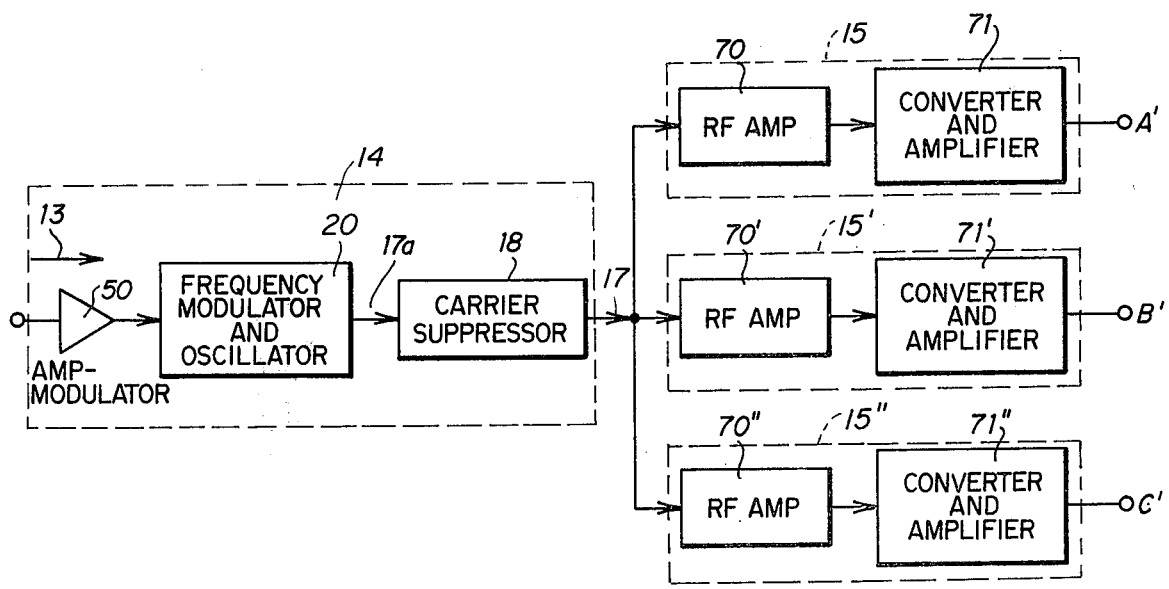
FIG. 2 is a block diagram schematic of a specific embodiment of the apparatus illustrated in FIG. 1.

In accordance with a preferred embodiment of the present invention, and with reference now to FIG. 2, the signal 13 is a conventional video television signal (the transducer 12 thus being a television camera and the information 11 being the scene or picture being televised) which, depending upon its amplitude or level, produces signals at the outputs of either decoder 15, 15', or 15", these signals appearing at and respectively driving the RED, GREEN, and BLUE inputs (represented in FIG. 2 as terminals A', B', and C'), of a color cathode ray tube (CRT) representing the utilization means 19. Color mixing is achieved by the CRT phosphor luminance/grid-cathode bias characteristics, with resultant hue of the CRT display being a function of the relative video signal amplitudes present at one or more of the CRT RED, GREEN, and BLUE inputs A', B', C'.

With continuing reference to FIG. 2, the video signal 13 is coupled by way of amplifier 50 to a frequency modulator device, which may be one of various types known in the art, said modulator 20 modulating an RF oscillator output according to the amplitude (and also the frequency) of signal 13. The output signal 17a therefore consists of the FM carrier plus a number of sidebands, the number of said sidebands, the power, frequency distribution, and frequencies being a function of the modulating amplitude and frequency. Since the input signal 13 is, in this example, primarily a composite video signal, such as a standard closed circuit television signal, the FM sideband output signals content of 17a becomes enormously complex; and further, as a composite video signal is a unidirectional signal, all sidebands are to either the high or low side of the FM carrier (to the high side, in the example to be described). It is essential to suppress the FM carrier for proper operation of the following circuitry; this is performed by a carrier suppressor 18, and the output signal 17 of suppressor 18 can be properly described as a Single Sideband Suppressed Carrier FM signal.

It should be understood that the term "single sideband" as used in this context includes the entire orders of FM sidebands above or below the FM carrier frequency produced by the described modulation (in contradistinction to an AM carrier wherein the modulation produces sidebands above and below the carrier frequency).

The signal 17 is then coupled to one or more RF amplifiers, such as 70, 70', 70", etc., which, for example, may comprise bandpass amplifiers or RF amplifiers with response curves modified or shaped to certain forms. The RF amplifier or amplifiers 70, 70', 70", etc., are then coupled to sideband detectors (converters) and amplifier means 71, 71', 71", etc., the amplitude or amplitudes of the output signals therefrom appearing at terminals A', B', and C' being indicative of the instantaneous amplitude of input video signal 13. As indicated in the drawing, each RF amplifier (70, 70', 70") and converter and amplifier means (71, 71', 71") constitute a decoder portion (15, 15', 15").

Figure 3:
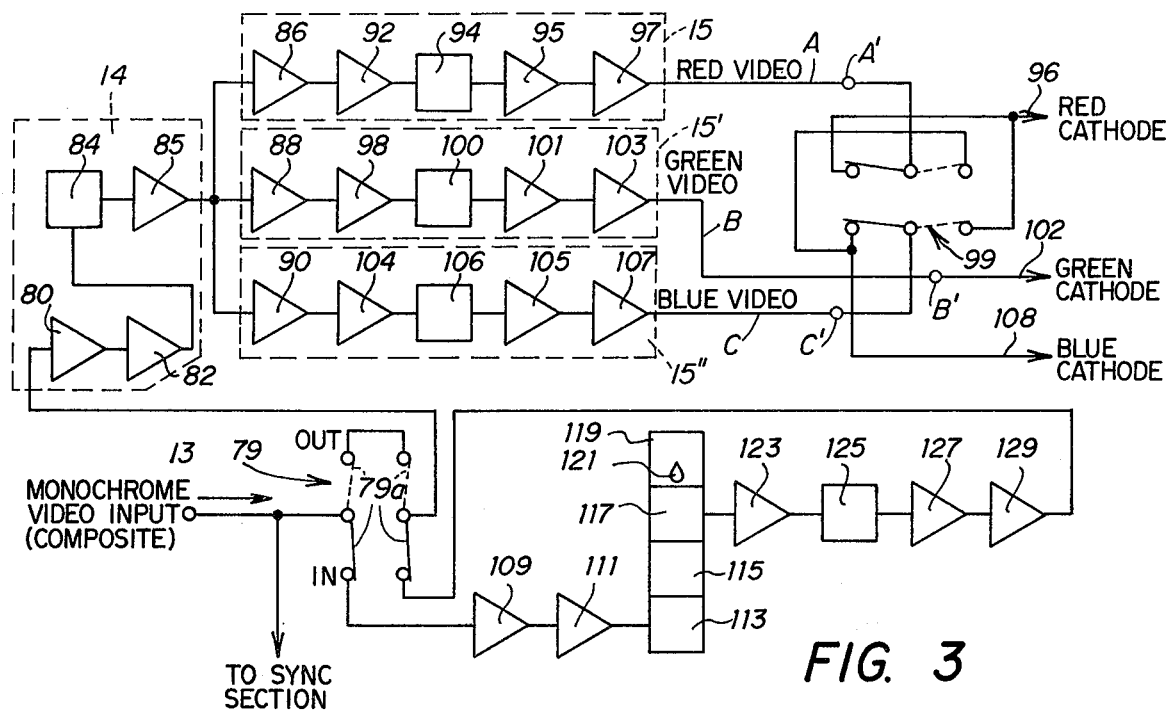
FIG. 3 is a detailed block diagram of the embodiment of FIG. 2.

Referring to FIG. 3, there is shown a more detailed block diagram of the embodiment of FIG. 2 wherein the amplitude varying video signal 13, is applied through a zone enhance switch 79 to the input of the modulator portion 14 specifically consisting of an initial isolation stage emitter follower amplifier 80, which output is coupled to the input of a wideband video amplifier 82. Coupled to the output of the amplifier 82 is means 84 including an FM modulator controlling an RF oscillator for the generation of a series of sidebands having a distribution varying in accordance with the amplitude (and frequency) of the video signals inputed to the amplifier 80.

These sidebands generated by the oscillator of means 84 are applied to the input of a carrier suppressor 85 having an output coupled to the input terminals of emitter follower amplifiers 86, 88 and 90, each constituting the initial stage of a "decoder" (15, 15', 15") disposed in a separate color primary channel. Emitter follower amplifier 86 is disposed in the channel A and has an output applied to the input of a frequency selector RF amplifier 92 that provides amplification to the output signal from the suppressor 85. The emitter follower amplifier 86 functions to isolate the input of the RF amplifier 92 from the suppressor 85 and the inputs to the emitter follower amplifiers (88, 90) of the other color primary channels. The selected RF signal from the amplifier 92 is coupled to a video detector 94. The frequency selector RF amplifier 92 responds to a particular response curve of the oscillator of means 84 and generates a signal to the detector 94, the output of which is connected to an emitter video driver 95, whenever the output signal of the oscillator of means 84 is within the characteristic response curve of the RF amplifier 92. Connected to the output of the driver 95 is a video amplifier 97 having an output coupled by way of terminal A' through a spectrum switch 99 to the "RED CATHODE" terminal 96 of the CRT for normal spectrum display.

The "decoder" portion 15' in color primary channel B is similar to that described with respect to the channel A and includes a frequency selection RF amplifier 98 coupled to the emitter follower amplifier 88 for supplying an output signal to a video detector 100. The RF amplifier 98 responds to a response curve different from the amplifier 92 and provides an output signal at a terminal 102 through a driver 101 and a video amplifier 103 when the sideband frequency from the oscillator 84 is within the characteristic response curve of the RF amplifier 98.

The decoder portion 15' in color primary channel C also includes a frequency selection RF amplifier 104 coupled to the output of the emitter follower amplifier 90 for supplying an amplified signal to a video detector 106. The characteristic response curve of the RF amplifier 104 is different from the RF amplifiers 92 and 98. Whenever the oscillator 84 has a frequency matching the selected response curve characteristic of the RF amplifier 104, an output signal appears at the detector 106. This output signal is coupled through a driver 105, a video amplifier 107 and by way of terminal C' to the spectrum reverse switch 99 (shown for a normal spectrum display) to the "BLUE CATHODE" terminal 108 of the CRT. The spectrum reverse switch 99, when in the position depicted by solid lines in FIG. 3, enables the color CRT display to be presented in a normal spectral order (see FIG. 5G), or when in the dashed line position, in a reversed spectral order (black in a monochrome video signal as red, white as blue, etc.).

With the contacts 79a of zone enhance switch in the "out" position (as shown by dashed lines), the video input signal 13 is coupled directly to the input of amplifier 80. With the contacts of the zone enhance switch 79 in the "in" position, (as shown in solid lines) a video input signal 13 is coupled to the input of an emitter follower amplifier 109 having an output coupled to a wideband video amplifier 111. These two amplifiers function in essentially the same manner as amplifiers 80 and 82.

The output terminal of the amplifier 111 is applied to an FM oscillator 113 operating in the UHF band and modulated by the output of the amplifier 111. This FM sideband output of the oscillator 113 is applied through absorption traps 115 and 117 that function to suppress the FM carrier at zero signal modulator inputs.

Connected to the absorption trap 117 is a heterodyne oscillator 119 having an output frequency adjustable by means of a control 121. The setting of the control 121 determines a particular FM sideband increment coupled to a mixer diode of the trap 117 from the output of the oscillator 113 and which will be selected by the response curve characteristics of the IF amplifier 123.

The output of the IF amplifier 123 is connected to a video detector 125 similar to the detector 94. Coupled to the output of the detector 125 is an emitter follower amplifier 127 delivering at its output a video signal to an inverting amplifier 129.

The output signal from the amplifier 129 is a peak negative synthesized signal representative of the amplitude excursion of a preselected increment of the input signal 13, the increment being determined by the setting of the control 121. A signal appearing at the output of the amplifier 129 is coupled through the zone enhance switch 79 to the input of the amplifier 80.

Figure 4:
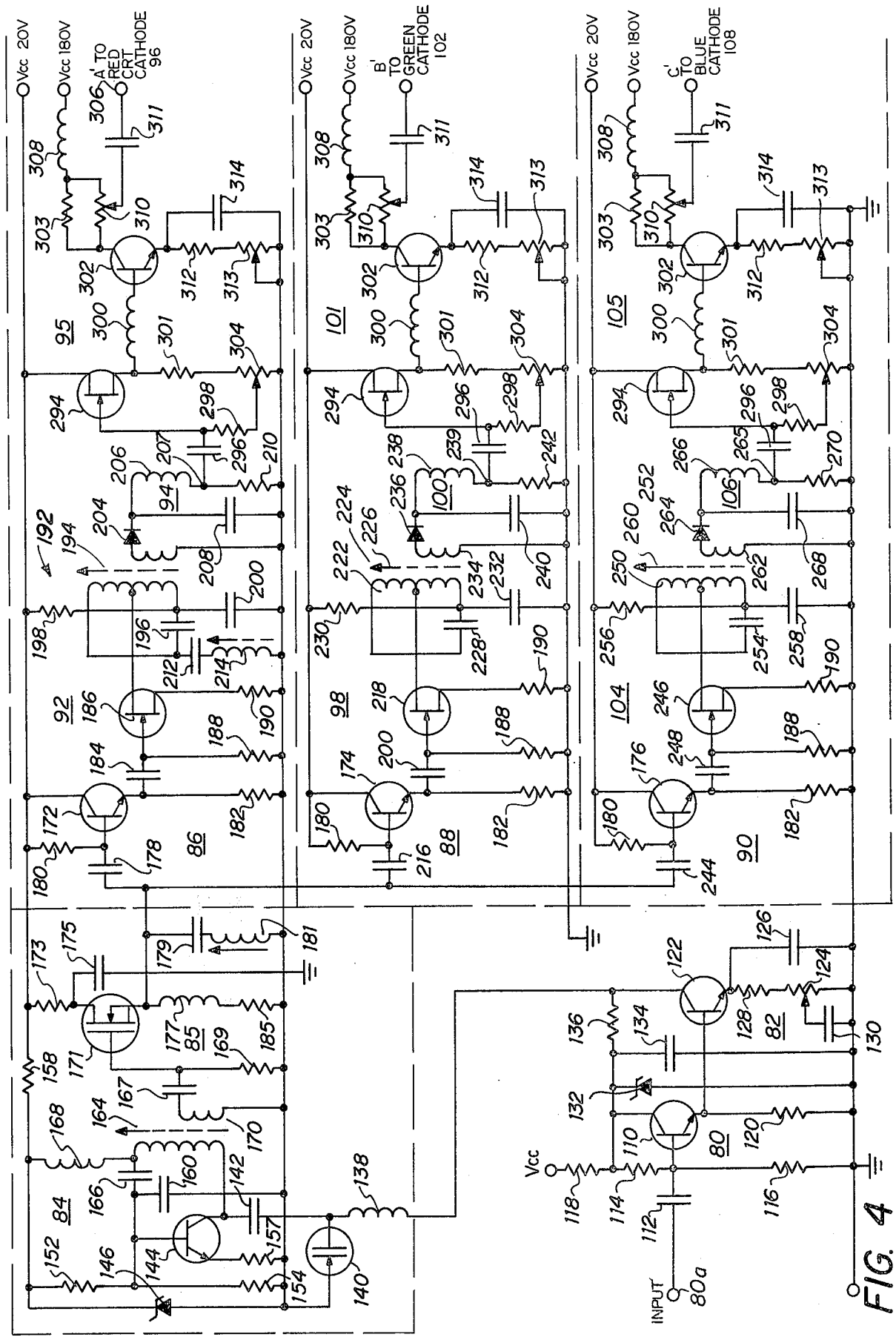
FIG. 4 is a detailed schematic circuit diagram of a preferred form of the modulation and decoder portions of the system depicted by the block diagram of FIG. 3.

Referring to FIG. 4, there is shown a schematic circuit diagram of a preferred embodiment of the modulator and decoder portions, of the system depicted in FIG. 3 wherein the signal to the amplifier 80 (provided by transistor 110 and related circuitry), is applied by way of the terminal 80 to the base electrode of the transistor 110 through a coupling capacitor 112. A base bias circuit for the transistor 110 includes resistors 114 and 116, the latter coupled to ground and the former tied to the positive terminal of a DC supply through a resistor 118. The emitter circuit for the transistor 110 includes a resistor 120 to ground and is direct coupled to the base electrode of a modulator transistor 122 of the amplifier portion 82. A direct coupling between the amplifier 80 (output of transistor 110) and the amplifier 82 (input to transistor 122) enhances the frequency response of the system.

An output signal from the amplifier 82 is generated at the collector electrode of the transistor 122 and varies in accordance with the input to the transistor 110. Transistor 122 includes a color intensity adjustment control comprising the emitter circuit including a variable resistor 124 and a parallel network of a peaking capacitor 126 and a resistor 128. The wiper arm of the variable resistor 124 couples to ground through a capacitor 130.

To provide a regulated Vcc voltage for the transistors 110 and 122, a Zener diode 132, in parallel with a capacitor 134, connects to the resistor 118, the collector electrode of the transistor 110 and to a load resistor 136 for the transistor 122.

Also comprising a part of the amplifier 82 is a series video peaking coil 138 coupled to the collector electrode of the transistor 122 and to the input of network 84 by way of the junction of a variable capacitance diode 140 and a capacitor 142. The variable capacitance diode 140 is tied to ground. The transistor 144 (and related circuitry) provides the RF oscillator portion of network 84.

A regulated Vcc voltage for driving the transistor 144 is supplied by a Zener diode 146 and a resistor 158 connected to a DC supply. The base circuit for the transistor 144 includes the divider network of a resistor 152 in series with a resistor 154 tied to ground. The emitter electrode circuit of the transistor 144 includes a resistor 157.

Oscillator transistor 144 operates as a Colpitts oscillator with a capacitor 160 in the base circuit and connected to ground. A variable inductance transformer 164 provides the inductive portion of the oscillating tank circuit for the transistor 144. Also included in the oscillator portion of network 84 is a coupling capacitor 166 and an RF choke 168.

The output from network 84 is coupled to the input of the carrier suppressor network 85 by way of a low impedance secondary winding 170 of the transformer 164 connected to the gate electrode of an IGT (MOSFET) transistor 171 which comprises the principal part of the carrier suppression circuit 85. A coupling capacitor 167 is connected between the winding 170 and the gate electrode of the transistor 171. Also as part of the gate electrode circuit is a bias resistor 169 connected to ground. The drain electrode of the transistor 171 connects to the positive terminal of a supply source through a resistor 173. The source electrode circuit of the transistor 171 includes a resistor 185 to ground in series with an RF choke 177. This maintains a high impedance for a high Q series trap including a capacitor 179 in series with a variable inductor 181. The high Q trap functions to suppress the FM carrier at the output of the transistor 171 to pass only the FM sidebands to the following circuitry.

The output of the transistor 171 at the source electrode is coupled by way of a coupling capacitor 178 to the base electrode of a transistor 172 comprising the principal part of the emitter follower amplifier 86. Also included as a part of the base electrode circuit is a bias resistor 180 connected to the positive terminal of a DC supply. Likewise, the collector electrode of the transistor 172 connects to the positive terminal of the supply source. The emitter electrode circuit of the transistor 172 includes a resistor 182 to ground and a coupling capacitor 184 tied to the gate electrode of a field effect transistor 186 which constitutes a key part of the frequency selection RF amplifier 92. Also connected to the transistor 186 is a gate resistor 188 and a source resistor 190.

Coupled to the drain electrode of the transistor 186 is a variable inductance transformer 192 also forming a part of the frequency selection circuit 92. Transformer 192 includes a primary winding 194 having a center tap tied to the transistor 186 and a capacitor 196 in parallel with the winding. A resistor 198 couples the transformer 192 to the positive terminal of a DC source and a capacitor 200 by-passes the transformer primary winding to ground. The secondary winding 202 of the transformer 192 is connected to the anode electrode of a detector diode 204 forming a part of the video detector network 94 which also includes a video peaking coil 206, an RF by-pass capacitor 208, and a load resistor 210. A voltage at terminal 207 varies in accordance with the response curve characteristic of the RF amplifier circuit.

For the color primary channel A, the frequency selection network 92 also comprises a trap circuit including a capacitor 212 in series with a variable inductor 214 and connected across the field-effect transistor 186. This trap circuit attenuates the FM sideband output of the transistor 186 at or near the FM oscillator 144 carrier frequency, thereby reducing the detector output at the terminal 207 to zero at the carrier frequency. This action effectively adds the color black to the red color primary channel A (or blue, if the spectrum reverse switch is in the reverse mode) and has the advantage in color CRT display for representation of the extreme white highlight content of an input monochrome video signal.

For the color primary channel B, the transistor 174 (of amplifier network 88) is coupled to the IGT (MOSFET) transistor 171 through a coupling capacitor 216. A voltage at the emitter electrode of the transistor 174 is coupled to the gate electrode of a field-effect transistor 218 through a coupling capacitor 200, the transistor 218 considered as part of the frequency selection RF amplifier 98. Each of the transistors 174 and 218 corresponds respectively to the transistors 172 and 186 in the color primary channel A and resistors in channel B are similarly numbered to correspond to the resistors of channel A.

An output at the drain electrode of the transistor 218 is coupled to the center tap of a primary winding 222 of a variable inductance transformer 224 having a positionable slug 226, all being a part of the frequency selection circuit 98. The primary winding 222 is shunted by a capacitor 228 and is tied to a DC source through a resistor 230. A capacitor 232 by-passes the transformer primary winding to ground. The secondary winding 234 of the transformer 224 is tied to the anode electrode of the detector diode 236 which is considered as part of the video detector 100. A voltage from the color primary channel B appears at the terminal 239. By adjusting the position of slug 226 in the transformer 224, the response curve characteristics of the frequency selection RF amplifier 98 can be made to differ from the response curve characteristics of the RF amplifier 92.

For the color primary channel C, the transistor 176 is a principal component of the amplifier 90 and has its input coupled to the output of the IGT transistor 171 through a coupling capacitor 244 and a voltage at the emitter electrode of this transistor is applied to the gate electrode of a field-effect transistor 246 through a coupling capacitor 248. Resistors connected to the transistors 176 and 246 are numbered as in channel A and have similar values.

An output voltage at the drain electrode of the transistor 246 is applied to the center tap of a primary winding 250 of a variable inductance transformer 252 all being part of the frequency selection network 104. In parallel with the primary winding 250 is a capacitor 254 and a resistor 256 ties the transformer to the positive terminal of a DC power supply. A capacitor 258 by-passes the primary winding 250 to ground. A positionable slug 260 varies the inductance of the primary winding 250.

The secondary winding 262 is connected to the anode electrode of a detector diode 264 of the video detector 106. An output voltage from the detector 106 appears at a terminal 265. Again, by varying the position of the slug 260 the response curve characteristics of the color primary channel C can be made to vary from the characteristics of the channels A and B.

Also shown in FIG. 4 is one embodiment of circuitry for the wideband amplifiers 95, 101 and 105 coupled respectively to output amplifiers 97, 103 and 107. With reference to channel A, a signal at the terminal 207 is applied to the gate electrode of a field-effect transistor 294 (amplifier 95) through a coupling capacitor 296. A biasing resistor 298 is tied between the gate electrode of the transistor 294 and the wiper arm of a variable resistor 304. The drain electrode of the transistor 294 is tied to the positive terminal of a DC supply and the source electrode is direct coupled by means of a video peaking coil 300 to the base electrode of a transistor 302. The source electrode of the transistor 294 is also connected to ground through a resistor 301 in series with the variable resistor 304.

An output voltage from the amplifier 97 appears at the collector electrode of the transistor 302 (amplifier 97) at a terminal 306 (A') through a capacitor 311. Also connected to the collector electrode of the transistor 302 is a drive circuit including a video peaking coil 308 in series with a resistor 303 and a variable resistor 310. In the emitter circuit for the transistor 302 is a resistor 312 in series with a variable resistor 313 and in parallel with a video peaking capacitor 314.

The amplifiers 101 and 105 of the channels B and C, and the amplifiers 103 and 107, are similar to that described with reference to channel A. Components of the channels B and C are similarly numbered.

Assuming a voltage gain of the amplifiers 95, 101 and 105 of about 80, the signal connected to each of the output terminals 96, 102 and 108 will be sufficient to drive each of the three guns of a CRT in a color saturation condition.

In operation, selectively an output appears at the terminals 207, 239 and 265 having an amplitude indicative of the amplitude of the video input signal 13 as applied to the amplifier 80. Each color primary channel selectively produces an output voltage at terminals A', B', or C' when the instantaneous amplitude of the varying input signal is within some preselected voltage increment related to the response curve characteristics of the respective frequency selection RF amplifiers of the various channels.

Figure 5:
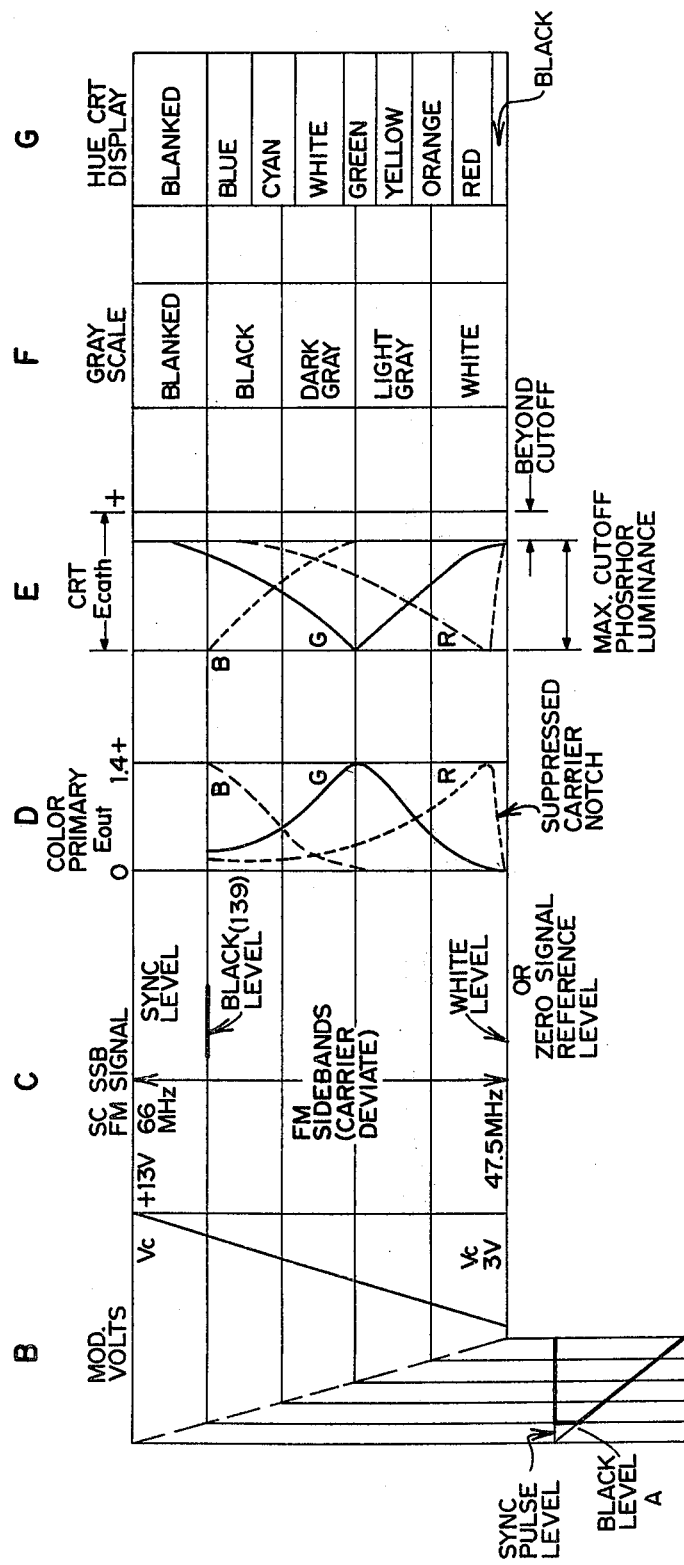
FIG. 5 is a series of waveforms illustrating the operation of the circuit of FIG. 4.

Referring to FIG. 5, a waveform of a test input applied to the transistor 110 of FIG. 4 in the form of a 15,750 Hz ramp test signal is shown at FIG. 5A. This signal is generated by a signal generator 121, see FIG. 6, and applied to the circuit of FIG. 4, identified by the block 123. An oscilloscope 125 also receives the test signal at the x-axis terminal. The y-axis terminal of the oscilloscope 125 is shown connected to the color primary channel G at terminal 102.

Figure 6:
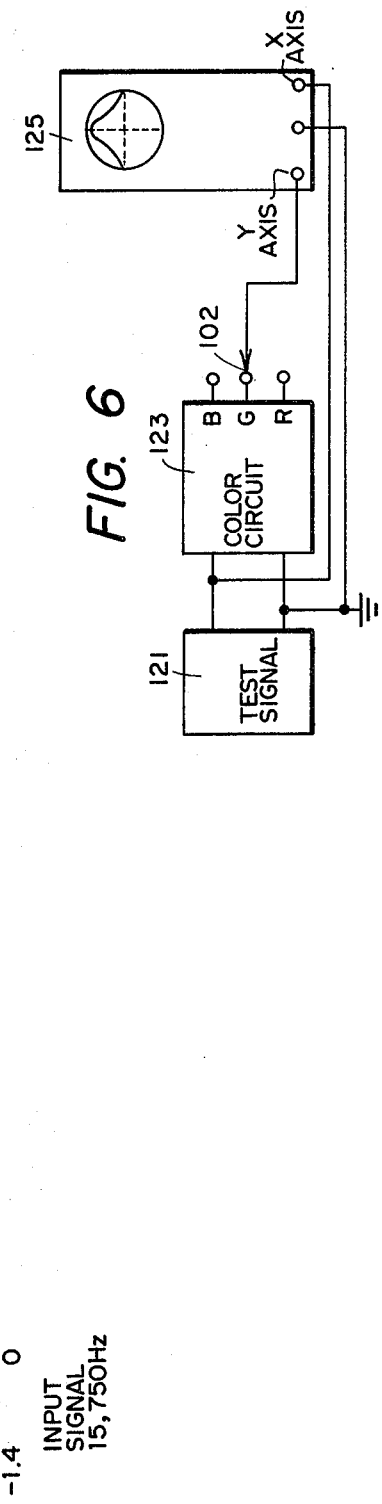
FIG. 6 is a block diagram showing utilization of the present invention in a test setup to generate the waveforms of FIG. 5.

The curves of FIG. 5 are typical for the test setup of FIG. 6. With no signal applied to the input of the amplifier 80 the FM oscillator 84 is adjusted to 47.5 MHz, and the trap circuit associated with the transistor 171 is adjusted to suppress the carrier frequency and provide zero or a minimum RF input to the amplifiers 86, 88 and 90 (FIG. 3). With this condition, the FM output at the source electrode of the transistor 171 (FIG. 4) is a suppressed carrier single sideband FM signal.

Consider now the application of a test signal as shown by FIG. 5A, the major portion (but not all) of the FM sideband power is approximately within the frequency limits as illustrated in FIG. 5C. With the circuitry of FIG. 4 connected in the test setup of FIG. 6 and the input signal of FIG. 5A generated by the signal generator 121 and oscilloscope connected to the terminal 102, the color primary signal from channel B at the output of the RF amplifier frequency selection circuit is adjusted to produce the curve G of FIG. 5D. This signal is amplified by amplifiers 101 and 103 (FIG. 3) to provide a peaking signal to the oscilloscope 125 as given by the curve G of FIG. 5E. Considering the other two channels of the circuit of FIG. 4, the color primary channel C is adjusted to produce an output signal at the terminal 108 given by the curve B of FIG. 5D. At the output of the amplifier 107 (FIG. 3) this signal produces an output as given by the curve B of FIG. 5E. This curve is sharply peaked at a black level reference line 139 to permit maximum luminance of the blue phosphor of a color CRT at an instantaneous amplitude level representing the black level in a composite video input signal. Finally, the color primary channel A is adjusted by a similar procedure as described above with regard to the channel B to produce the curve R of FIG. 5D at the terminal 207. A variation in the adjustment of channel A produces a red output signal at a maximum level to indicate white for the video input signal. To accomplish this, the RF amplifier 94 of channel A must be resonated very near the zero signal FM output signal (carrier center). The high Q signal traps 212 and 214 (FIG. 4) provide further suppression of the FM carrier to insure a zero signal output from the terminal 96 (FIG. 3) at the zero instantaneous amplitude point of an input video signal, and further adds black to the color spectrum available in a color CRT display. This signal applied to the CRT is given by the curve R of FIG. 5E.

The three color outputs from the video amplifiers 97, 103 and 107 (FIG. 3) as given by the curves B, G and R of FIG. 5E are related to the monochrome input signal 13 applied to the amplifier 80 by the chart of FIGS. 5F and 5G. As the three curves B, G and R vary from cutoff to maximum phosphor illuminance, the relation to the monochrome input signal varies from black when the curve B is a maximum to white when the curve R is near maximum. The actual color display on a color CRT is listed in the chart of FIG. 5G. Only the commonly named hues are identified in the blocks. The actual appearance of the color display, due to the color mixing of the CRT phosphors, varies in accordance with the relative signal amplitudes at the respective cathodes.

To produce the various waveforms of FIG. 5, the variable inductance slugs of each of the transformers 192, 224, and 252 (FIG. 4) are positioned to provide a particular response curve characteristic for the individual channel frequency selection circuits. According to the waveforms of FIG. 5, when the voltage at the terminal 96 (FIG. 3) is at a maximum level, the voltages at the terminals 102 and 108 are at a low value. When the voltage at the terminal 102 is at a maximum level for a particular level of video input signal applied to the amplifier 80, the signal at the terminals 96 and 108 will be of some intermediate value. For still a third preselected level of input signal to the amplifier 80, the voltage at the terminal 108 will be at a maximum while the voltages at the terminals 96 and 102 will be at a minimum value. Thus, the voltage at each of the terminals 96, 102 and 108 varies in accordance with the amplitude of the video input signal 13 as applied to the amplifier 80.

As an example of the application of the system of FIG. 4, assume a negative going video camera signal ($x$-ray for example) is applied to the input of the amplifier 80. Those portions of the signal representing white highlights are displayed as dark red to black on the tube of a CRT, the black of the video signal is displayed as blue on the tube and the intermediate grays of the black and white video signal are displayed as shades of orange, yellow through green, cyan and to blue according to the corresponding changes represented on the Gray Scale of FIG. 5F.

Figure 7:
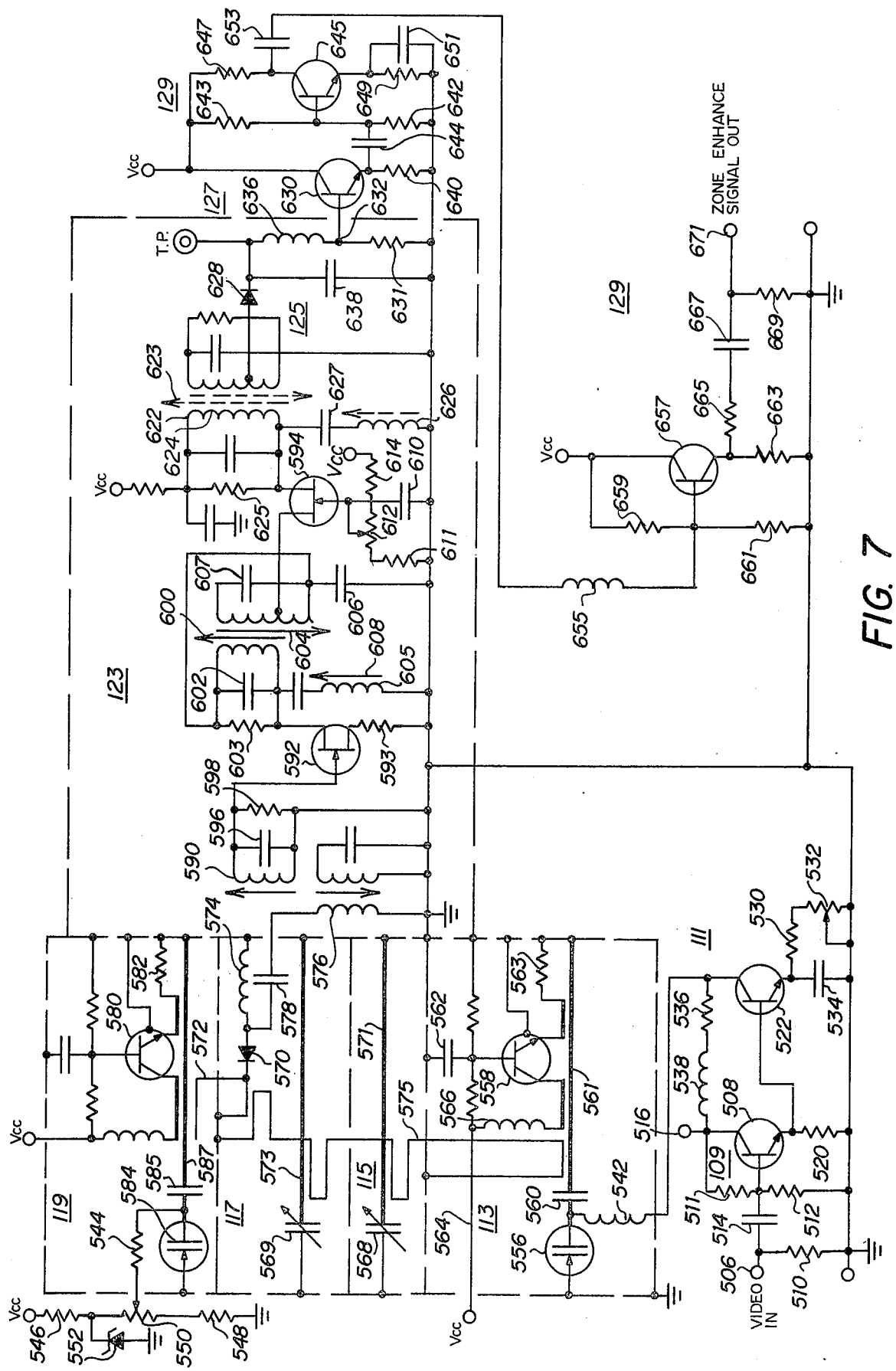
FIG. 7 is a detailed schematic circuit diagram of a preferred form of the zone enhance circuit portions of the system depicted in FIG. 3.

Referring to FIG. 7, there is shown a schematic of the zone enhance circuit portion of FIG. 3 wherein the video input signal is applied by contacts 79a to the input terminal 506 (input to amplifier 109) of a base electrode circuit to a transistor 508. The base electrode circuit for the transistor 508 includes resistors 510, 511 and 512 along with a capacitor 514. A collector electrode of the transistor 508 connects to a DC biasing source at a terminal 516 and the emitter electrode connects to a resistor 520, also connected to ground. A signal from the amplifier 508 is direct coupled to the base electrode of a modulator transistor 522 which forms a key portion of video amplifier 111.

The emitter electrode of the transistor 522 is connected to a circuit including a resistor 530 in series with a variable resistor 532 and both connected in parallel to an emitter peaking capacitor 534. An output from the modulator transistor 522 is taken at the collector electrode having a connection to the terminal 516 through a resistor 536 in series with a series video peaking coil 538.

A signal at the collector electrode of the modulator transistor 522 is applied through a peaking coil 542 to the junction of a variable capacitance diode 556 and the series combination of a resonance tuning capacitor 560 in a line 561. Transistor 558 and associated circuitry including a resistor 563 and a capacitor 562 functions as the FM oscillator 113 to generate a signal to a mixer diode 570. The Vcc voltage for the transistor 558 is supplied on line 564 through an RF choke 566.

Coupled to the FM oscillator transistor 558 are tuned lines 571 and 573 adjustable in resonant frequency by capacitors 568 and 569. These lines successively act as absorption traps 23 and 24 in order to suppress the carrier frequency. The FM sidebands are coupled to a mixer diode 570 through a signal feed line 575. The mixer diode 570 has a cathode electrode connected to an inductor 572, the latter connected to ground. An output from the mixer circuit appears across a winding 576 through a capacitor 578.

Also coupled to the diode 570 is a signal from a beat oscillator network 119 consisting of a transistor 580 operated as a grounded base oscillator having an emitter coupled to ground through a resistor 582 and a collector electrode fed by an RF choke. The emitter and collector being capacitively coupled to a resonant line 587, which is tuned by the series combination of a variable capacitance diode 584 and a capacitor 585. The output frequency of the heterodyne oscillator is adjusted by applying a voltage from the wiper arm of a potentiometer 550 through an isolation resistor 544 to the junction of the voltage variable capacitance diode 584 and the capacitor 585. The wiper arm of the potentiometer 550 functions as an externally adjusted control identified as a "Zone Select." The frequency relationships of the FM oscillator 113, the "Zone Select" oscillator 119, and a line indicating mixer output are illustrated in FIG. 8D.

A signal on the line 576 from the mixer circuit is applied to the primary winding of a variable inductance transformer 590 as the input to a two-stage cascade type IF amplifier (123 of FIG. 3) including transistors 592 and 594. The gate electrode of the transistor 592 is coupled to the secondary of the transformer 590 and to a capacitor 596 in parallel with a resistor 598. The source electrode of the transistor 592 is grounded through a resistor 593 and the drain electrode connects to a tank circuit including a transformer 600 having a primary winding in parallel with a capacitor 602 and a resistor 603. Capacitor 604 and a tuning coil 605 form a series connected trap.

The secondary winding of the transformer 600 includes a center tap connected to the source electrode of the transistor 594. In parallel with the secondary winding is a capacitor 607 in series with a by-pass capacitor 606 to ground. The gate electrode of the transistor 594 connects to a gain control circuit including a by-pass capacitor 610 and a variable resistor 612, the latter in series with a resistor 614 connected to the Vcc supply.

The drain electrode of the transistor 594 is connected to a winding 622 in parallel with a capacitor 624 and a resistor 625, the combination of which is in series with a tuning coil 626 and capacitor 627. The amplified RF signal from the transistor 594 is applied to the video detector circuit 125 including a diode 628. The wideband video detector circuit including the diode 628 is similar to those included in the color primary channels, as previously described, and provides a base drive signal to the network 127 (FIG. 3) comprising a transistor 630 connected as an emitter follower. In the example given, the detector voltage must exceed 0.6 volts (approximately the barrier voltage of a silicon device) before the transistor 630 can conduct. This is illustrated in FIG. 8E. This eliminates a response to low amplitude signals beyond the intended response curve of the intermediate frequency amplifier.

Connected to the base electrode of the transistor 630 is a resistor 634 in series with an inductor 636, both parallel by a capacitor 638 all forming a part of the wideband detector. The emitter electrode circuit for the transistor 630 includes resistors 640 and 642 along with a capacitor 644.

By varying the setting of the variable resistor 550, the frequency of the heterodyne oscillator 580 is varied by changing the DC voltage applied to one terminal of the diode 584. This effectively allows the enhancement of any portion of the input signal at the terminal 506, for example, any one one-fourth increment of the input signal applied to the input terminal. By varying the gain through adjustment of the resistor 612, an output signal at the terminal 632 varies over the same range regardless of the input voltage as applied to the terminal 506. Thus, the zone enhance circuit 324 may be switched into and out of the signal path at any suitable point without disturbance of other control settings.

Connected to the emitter electrode of the transistor 630 through the capacitor 644 is a transistor 645 (forming part of inverting amplifier 129) having an emitter electrode tied to a circuit including the resistor 649 in parallel with an emitter peaking capacitor 651. Appearing across the collector load resistor 647 of the transistor 645 is an output signal coupled through a capacitor 653 and video peaking coil 655 to the base electrode of a transistor 657. The base electrode of the transistor 657 is biased by a voltage divider network including resistors 659 and 661. The emitter electrode of the transistor 657 is connected to a load resistor 663 and provides an output signal through a line matching resistor 665 and a capacitor 667 in series with a resistor 669 to provide the selected zone signal output at a terminal 671. The output signal at the terminal 671 is connected to the in-out zone enhance switch 79 for coupling to the circuitry of FIG. 4.

As a further explanation of the operation of the zone enhance circuit, FIG. 8A illustrates a typical input test signal as connected to the terminal 506.

Figure 8:
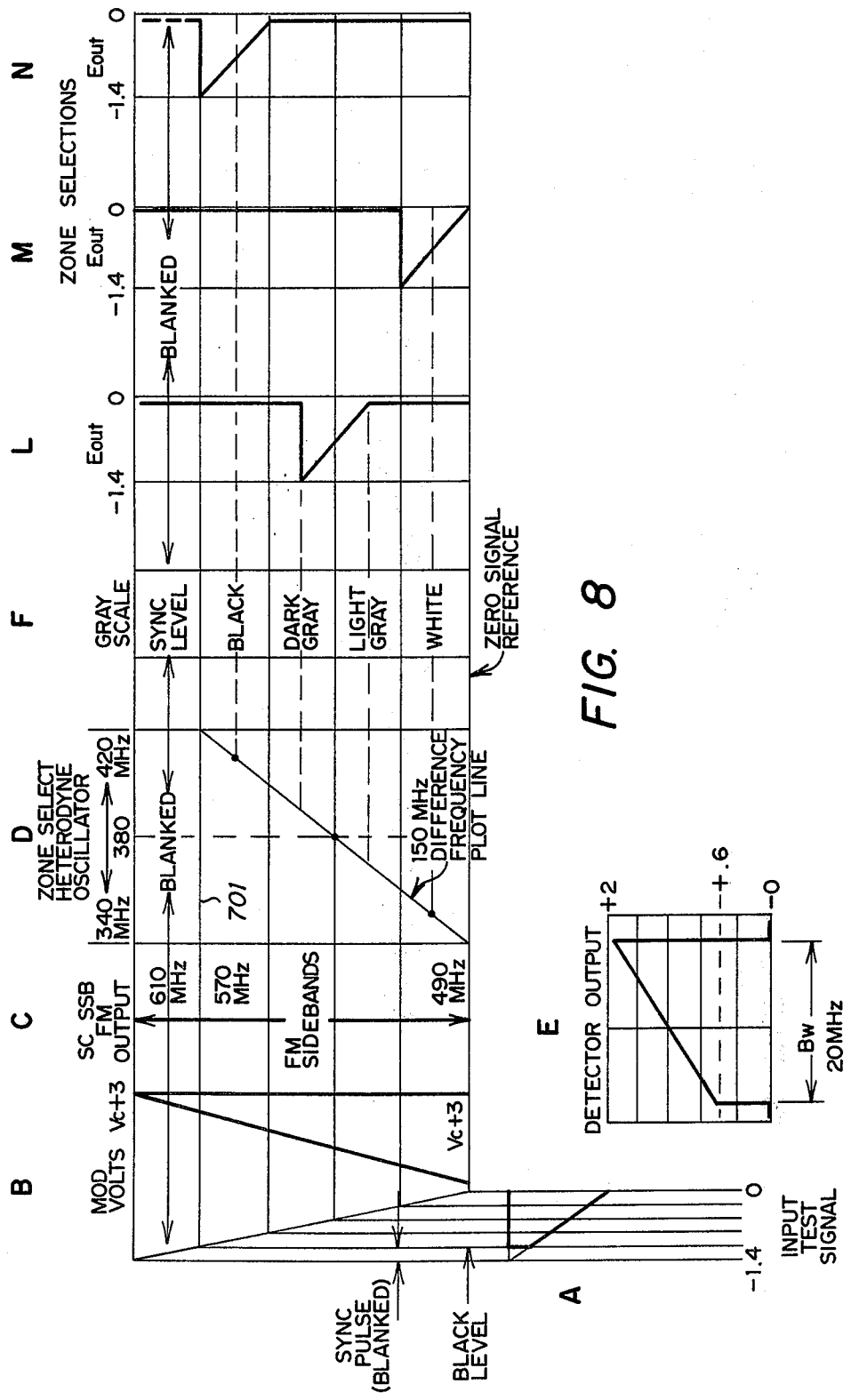
FIG. 8 is a series of waveforms for illustrating the operation of the zone enhance circuit of FIG. 7.

Referring to FIG. 8, there is shown a series of waveforms developed from the testing of circuitry of FIG. 7 with an input test signal as given by the curve A. With this input signal the output of the transistor 522 (FIG. 7) is shown by curve B, and the FM sideband output of the transistor 558 is contained within the UHF range as indicated by curve C. The IF frequency plot line of curve D illustrates that the IF amplifier responds to a central increment of the FM oscillator sideband output over the range of frequency indicated at C. Note, that any voltage appearing above the indicated black level line 701 is blanked at the cathode ray tube by operation of a blanking circuit as part of the CRT drive (not shown).

The waveform of curve L appears at the output terminal 671 (FIG. 7) indicating that the zone enhance network output varies over an increment of approximately ¼ of the gray scale of the monochrome video input signal 13 applied to the switch 79. This increment has been selected and amplified to the level of a signal normally applied to the amplifier 80. Other increments of input signal may be selected by adjusting the zone select variable resistor 550 (FIG. 7). Two additional increments are illustrated by the curves M and N. The waveforms as indicated by curves L, M and N are the amplified signals of the output of the network as given by the waveform of curve E. Curve E indicates that an increment of approximately one-fourth of the gray scale of the input video signal has been selected and amplified to the original input signal amplitude. Other increments of the input signal amplitude may be selected and amplified to the original input signal amplitude.

Referring the selected increments to the gray scale of the chart F, the curve L varies over the light gray to dark gray signal areas of a video input. The curve M indicates an increment of an input signal related to white levels of video input data. Black levels of video input data are indicated by the curve N.

What is claimed is:

1. A system for converting an amplitude varying monochrome video input signal into an output signal repesentative of a particular amplitude segment of the said input signal, said system being effective to generate a color display indicative of the information represented by the monochrome video signal and comprising in combination:

oscillator means for generating a first signal, modulator means responsive to the said input video signal for modulating the said first signal of the oscillator means in accordance with the varying amplitude of the monochrome signal, thereby to provide an output signal from said oscillator means comprising a carrier frequency and a plurality of sidebands having a frequency distribution representative of the amplitude of said video signal, RF amplifier means responsive to the modulated output signal from said oscillator means, carrier suppression means responsive to the output signal from said RF amplifier means for suppressing the said carrier frequency, frequency selective amplifier means coupled to said carrier suppression means for generating an output signal responsive to one of said sidebands being within the response characteristics of said frequency selective amplifier means and varying only within a preselected amplitude increment of the monochrome video input signal, detector means responsive to the output signal from said frequency selective amplifier means, and a multiple input cathode ray tube having its input terminals coupled to the output of said detector means, means for selecting and enhancing the said amplitude increment of said monochrome video input signal furnished to said modulator.

2. A system for converting an amplitude varying monochrome video input signal into an output signal representative of a particular amplitude segment of the said input signal, said system being effective to generate a color display indicative of the information represented by the monochrome video signal and comprising in combination:

a voltage controlled oscillator generating a first signal, a modulator responsive to the said input video signal for modulating the said first signal of the oscillator in accordance with the varying amplitude of the monochrome signal, thereby to provide an output signal from said oscillator comprising the carrier frequency and a plurality of sidebands having a frequency distribution representative of the amplitude of said video signal, an RF amplifier responsive to the modulated output signal from said oscillator, carrier suppression means responsive to the output signal from said RF amplifier for suppressing the said carrier frequency, frequency selective RF amplifier means coupled to said suppression means, said RF amplifier means generating an output signal responsive to one of said sidebands being within the response characteristics of said frequency selective amplifier means and varying only within a preselected amplitude increment of the monochrome video input signal, detector means responsive to the output signal from said frequency selective amplifier means, a multiple input cathode ray tube having its input terminals coupled to the output of said detector means, and means for selecting and enhancing the said amplitude increment of said monochrome video input signal furnished to said modulator.

3. A system as set forth in claim 2 including means for varying the preselected amplitude increment of said video input signal.

4. A system for converting a monochrome amplitude varying video input signal into a series of amplitude related signals for a color display of the monochrome video signal, comprising in combination:

a voltage controlled oscillator generating a carrier frequency, a modulator responsive to the monochrome signal and having an output connected to said oscillator for modulating the carrier frequency in accordance with the varying amplitude of the monochrome signal, means for selecting and enhancing a particular increment of the video input signal coupled to said modulator, said means comprising:

an oscillator, means for modulating the output frequency of said oscillator in accordance with the varying amplitude of the input signal, amplifier means for amplifying the frequency modulated output of said oscillator, and band-pass means responsive to the amplified output of said amplifier means and having a center frequency and band-pass characteristic for generating an output signal at a preselected segment of input signal, an RF amplifier responsive to the modulated output of said voltage controlled oscillator and generating an amplified output related thereto, and a plurality of frequency selection RF amplifiers individually connected to said RF amplifier each having a selected center frequency and band-pass characteristic for selectively passing a sideband signal varying only within a preselected amplitude segment of the input signal, and a multiple input cathode ray tube having separate inputs for each of a selected number of colors, said inputs individually connected to one of said RF detectors.

5. A system for converting a monochrome amplitude varying video input signal into a series of amplitude related signals as set forth in claim 4 including means for varying the preselected increment of input signal generating output signals from said plurality of frequency selective RF amplifiers.

6. A system for converting a monochrome amplitude varying video input signal into a series of amplitude related signals for color display of the monochrome signal, comprising in combination:

a voltage controlled oscillator generating a carrier frequency, a modulator responsive to the monochrome signal and having an output connected to said oscillator for modulating the carrier frequency thereof in accordance with the varying amplitude of the monochrome signal, means for selecting and enhancing a particular increment of input signal as coupled to said modulator, carrier suppression means responsive to the modulated output of said oscillator to suppress the FM carrier and generating an output signal varying over a single sideband, a plurality of frequency selective RF amplifiers having a common connection to said suppression means, each amplifier having a different center frequency and band-pass characteristic for selectively passing a sideband signal from said suppression means varying only within a preselected amplitude segment of the monochrome signal, circuit means for attenuating the output of at least one of said plurality of RF amplifiers to selectively limit the generated output signal at a desired amplitude of input signal, a plurality of detector means individually connected to the output of one of said RF amplifiers and generating an output signal, and a multiple input color cathode ray tube having separate inputs for each of a selected number of colors, said inputs individually connected to one of said detector means.

* * * * *